United States Patent [19]
Oki et al.

[11] Patent Number: 5,605,844
[45] Date of Patent: Feb. 25, 1997

[54] INSPECTING METHOD FOR SEMICONDUCTOR DEVICES

[75] Inventors: Shinichi Oki; Koichi Nagao, both of Osaka; Yoshiro Nakata, Kyoto, all of Japan

[73] Assignee: Matsushita Electric Industrial Co., Ltd., Osaka, Japan

[21] Appl. No.: 624,954

[22] Filed: Mar. 27, 1996

[30] Foreign Application Priority Data

Mar. 31, 1995 [JP] Japan ................... 7-076071

[51] Int. Cl.⁶ ................................. H01L 21/66
[52] U.S. Cl. .................. 437/8; 437/212; 437/226
[58] Field of Search ................. 437/8, 212, 226; 148/DIG. 12, DIG. 28, DIG. 162

[56] References Cited

U.S. PATENT DOCUMENTS

| | | | |
|---|---|---|---|
| 4,542,397 | 9/1985 | Biegelsen et al. | 437/212 |
| 5,288,663 | 2/1994 | Ueki | 437/226 |
| 5,489,538 | 2/1996 | Rostoker et al. | 437/8 |
| 5,532,174 | 7/1996 | Corrigan | 437/8 |

*Primary Examiner*—Chandra Chaudhari
*Attorney, Agent, or Firm*—McDermott, Will & Emery

[57] ABSTRACT

A semiconductor wafer is affixed on a dicing sheet having an appropriate expansibility. Then, a dicing operation is performed on the semiconductor wafer without dividing the dicing sheet, thereby dividing a plurality of semiconductor chips from each other. After aligning a contactor against the semiconductor wafer, the semiconductor wafer is fixed to the contactor. In this case, protrusions provided on the contactor are inserted into the gap between semiconductor chips. The protrusions cause a shift movement toward the peripheral edge of the contactor in response to thermal expansion of the contactor, thereby expanding the gap between semiconductor chips. Then a burn-in is performed on all of the plural semiconductor chips of which gap is expanded.

18 Claims, 15 Drawing Sheets

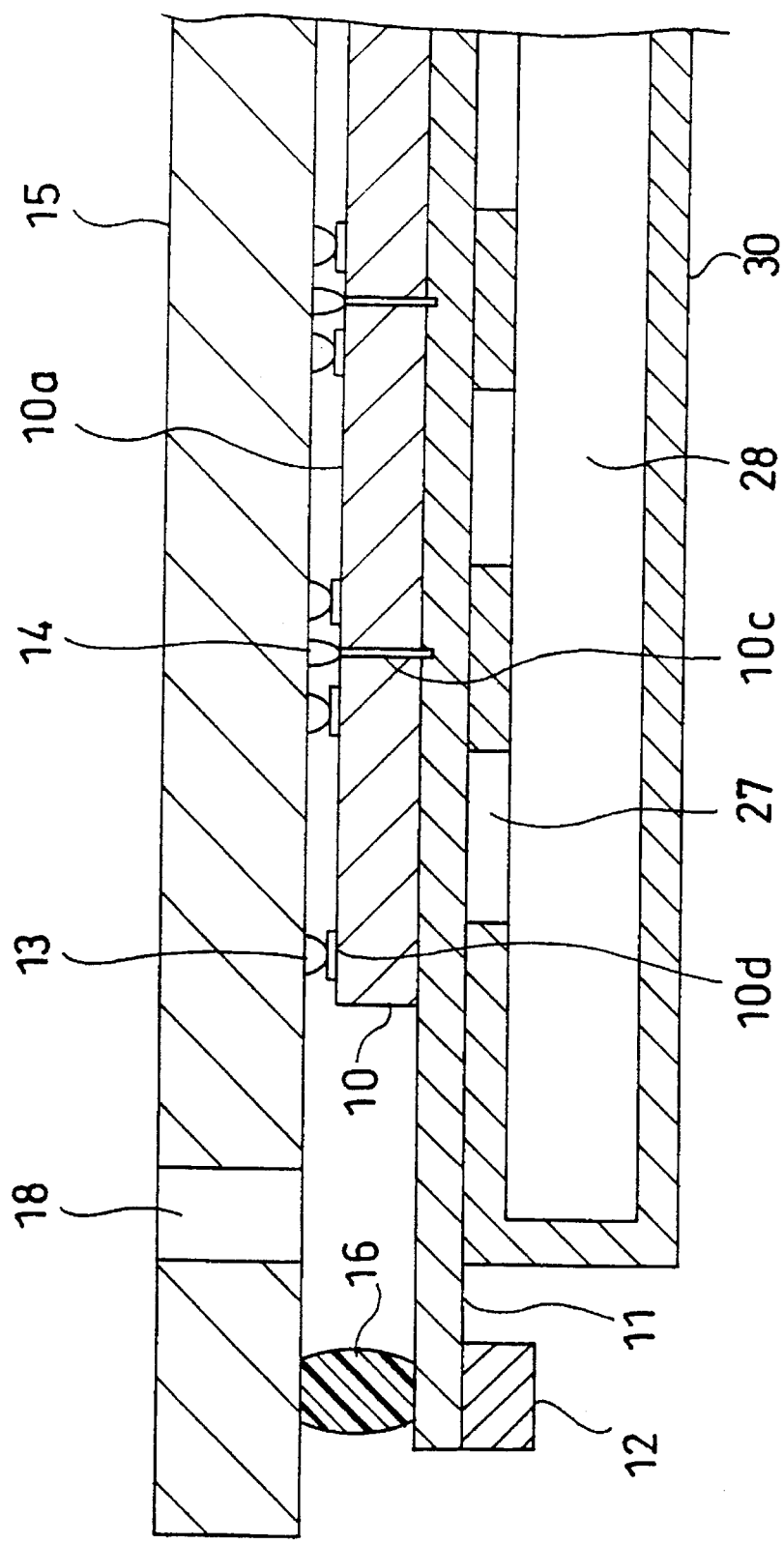

F I G.11( a )
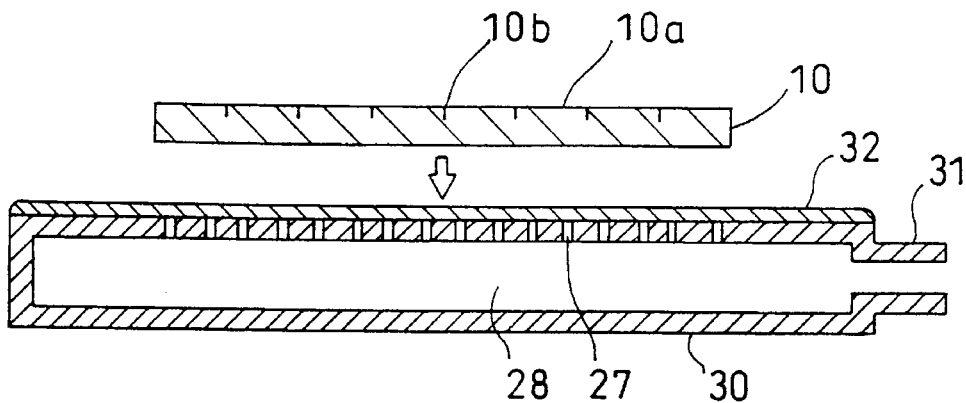
F I G.11( b )
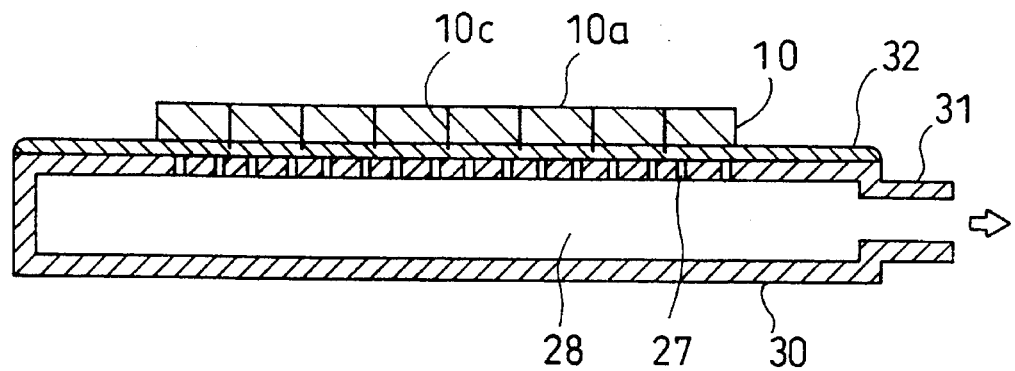
F I G.11( c )
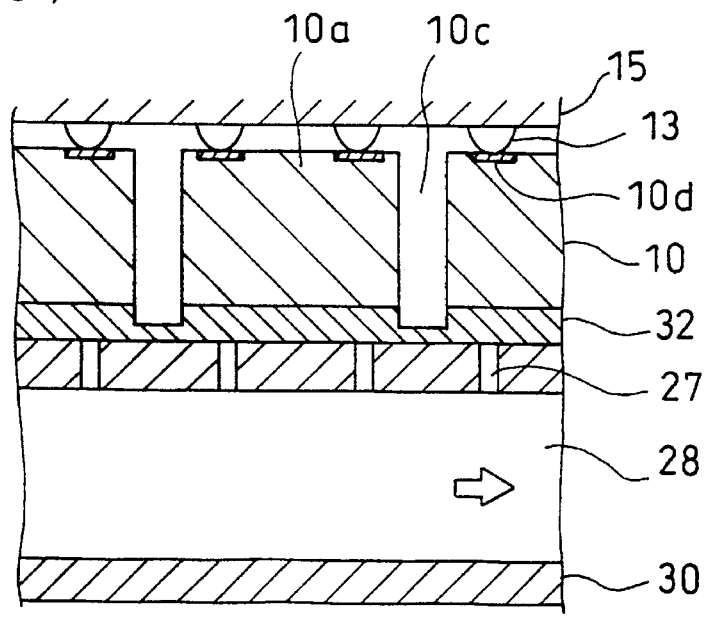

INSPECTING METHOD FOR SEMICONDUCTOR DEVICES

BACKGROUND OF THE INVENTION

The present invention relates to an inspecting method for a semiconductor device by which a plurality of integrated circuits of semiconductor chips formed on a semiconductor wafer are inspected at a time in the wafer state.

Advancement of electronic components mounting semiconductor integrated circuit devices (hereinafter referred to semiconductor devices) is remarkable in size reduction and price reduction in the past few years. With this advancement, the demand to size reduction and price reduction of semiconductor devices is further increasing.

According to a general mounting operation of semiconductor devices onto a printed circuit board, each semiconductor chip is electrically connected to a corresponding lead frame by means of a bonding wire, then the semiconductor chip and the lead frame thus connected are sealed by resin or ceramic before they are mounted on the printed circuit board. Meanwhile, the requirements to size reduction of electronic components made it possible to develop a novel mounting method of directly mounting electronic components on a printed circuit board when each semiconductor device is still in a semiconductor wafer state (hereinafter, the semiconductor device in this condition is referred to as "bare chip"). In view of introduction of such an advanced method, it will be significantly required to provide cheap and excellent bare chips whose quality are guaranteed.

To assure the quality of the bare chip, it is normally required to inspect each of semiconductor devices in the wafer state by a burn-in or the like. Performing one inspection to every single chip or minor group chips formed on a semiconductor wafer will take a long time to complete the inspection for all of numerous bare chips. Such an inspecting method is not practical to adopt in view of time and cost. Accordingly, there is an earnest need to the method capable of inspecting all the bare chips at a time in the wafer state by the burn-in or the like.

In the inspection of bare chips in the wafer state performed at a time, it is generally necessary to simultaneously apply a power voltage and a signal to each test electrode provided on each of plural semiconductor chips formed on one semiconductor wafer so as to operate all of the plural semiconductor chips. To this end, it will be necessary to prepare a probe card having extremely numerous (normally several thousands or more) probe needles each being brought into contact with a corresponding test electrode. However, a conventional needle type probe card cannot fulfill the task required in view of the number of pins and cost.

According to related proposals, there is known a contactor made of a thin probe comprising bumps formed on a flexible substrate (refer to Nitto Technical Bulletin, Vol.28, No.2, October 1990, PP.57–62).

Hereinafter, a burn-in using the above-described contactor will be explained in detail.

FIGS. 15(a) and 15(b) are cross-sectional views respectively showing a probing condition using the contactor. In FIGS. 15(a) and 15(b), reference numeral 100 represents a card type contactor. This contactor 100 comprises a polyimide substrate 101, a wiring layer 102 formed on the polyimide substrate 101, a bump 103 serving as a probe terminal, and a through hole wiring 104 connecting the wiring layer 102 and the bump 103.

As illustrated in FIG. 15(a), by pressing the contactor 100 against a semiconductor wafer 110 which is a substrate to be tested, a pad 111 formed on the semiconductor wafer 110 as a test electrode is electrically connected to the bump 103 of the contactor 100. If the temperature is maintained at the room temperature, the inspection will be successfully accomplished by simply applying a power voltage or a signal to the bump 103 through the wiring layer 102.

However, some of inspections in the atmosphere of high temperatures such as burn-in are conducted, heating up the semiconductor wafer 110 for temperature acceleration. FIG. 15(b) is a cross-sectional view showing a typical structural condition resulting from a heating operation to semiconductor wafer 110 wherein the temperature is increased from the room temperature, 25° C., to 125° C. In FIG. 15(b), the left half shows a central region of the semiconductor wafer 110, while the right half shows a peripheral region of the semiconductor wafer 110.

Polyimide constituting the polyimide substrate 101 has a larger thermal expansion coefficient than that of a silicon constituting the semiconductor wafer 110 (more specifically, the thermal expansion coefficient of silicon is $3.5 \times 10^{-6}$/°C., while the thermal expansion coefficient of polyimide is $16 \times 10^{-6}$/°C.). Due to this thermal expansion difference, the peripheral region of the semiconductor wafer 110 is subjected to a significant dislocation caused between bump 103 and pad 111. For example, it is now supposed that the semiconductor wafer 110 and the contactor 100 are aligned under the room temperature, and then they are heated up to 100° C. As a result of this heating operation, 6 inches of semiconductor wafer 110 expands only 35 μm whereas the contactor 100 expands 160 μm. This means that the pad 111 and the bump 103 are dislocated from each other by 125 μm in the peripheral region of the semiconductor wafer 110. For this reason, the peripheral region of semiconductor wafer 110 no longer maintains electrical connection between the pad 111 and the bump 103.

As explained in the foregoing description, according to the conventional inspecting method of a semiconductor device, the semiconductor wafer is inevitably subjected to high temperatures and the contactor being brought into contact with the semiconductor wafer is also subjected to high temperature. Due to the difference in thermal expansion coefficient between the semiconductor wafer and the contactor, there is caused so significant dislocation in the peripheral region of the semiconductor wafer that no electrical connection is maintained between the pad and the bump.

SUMMARY OF THE INVENTION

Accordingly, in view of above-described problems encountered in the prior art, a principal object of the present invention is to provide an inspecting method for a semiconductor device which assures that the probe terminals of the contactor are surely brought into contact with corresponding test electrodes of the semiconductor wafer even in the peripheral region of the semiconductor wafer when the high-temperature inspection such as burn-in is performed in a batch manner in the wafer state.

In order to accomplish this and other related objects, the present invention provides a first inspecting method for a semiconductor device, according to which a semiconductor wafer is subjected to a dicing operation under the condition that the semiconductor wafer is fixed to an expandable sheet so as to divided into plural semiconductor chips, and then thermal expansion of a contactor is utilized to expand the gap between semiconductor chips, thereby causing a sort of pseudo expansion of semiconductor wafer.

More specifically, the first aspect of the present invention provides an inspecting method for a semiconductor device, comprising: a first step of fixing a semiconductor wafer on an expandable sheet, said semiconductor wafer being formed with a plurality of semiconductor chips each having a test electrode; a second step of dividing said plural semiconductor chips from each other by dicing said semiconductor wafer fixed on said sheet without dividing said sheet; a third step of aligning a contactor for supplying an electric signal to said test electrode of each semiconductor chip against said semiconductor wafer after performing said dicing operation, and fixing said semiconductor wafer to said contactor; and a fourth step of heating said semiconductor wafer fixed to said contactor so as to expand a gap between adjacent semiconductor chips in response to thermal expansion of said contactor, and then performing a burn-in on all of said plural semiconductor chips.

According to the first inspecting method for a semiconductor device above described, when the semiconductor wafer comprising plural divided semiconductor chips is heated, the gags between the semiconductor chips are expanded in response to the thermal expansion of the contactor because the semiconductor wafer is fixed to the contactor, so as to realize the pseudo expansion of the semiconductor wafer. Hence, the burn-in is no longer bothered by the dislocation generated between a test electrode of each semiconductor chip and a corresponding probe terminal of the contactor even in the peripheral region of the semiconductor wafer. In this case, the expansibility of the sheet allows the sheet to expand in response to the thermal expansion of the contactor or the expansion of the gap between semiconductor chips. Accordingly, no dislocation is found between the test electrode of each semiconductor chip and the corresponding probe terminal of the contactor even in the peripheral region of the semiconductor wafer. Thus, the burn-in can be performed in a batch manner in the wafer state.

According to the conventional method, the dicing operation was performed after the burn-in. Thus, there was the possibility that some semiconductor chips are damaged by static electricity generated in the dicing operation, causing the necessity of performing an additional inspection after the dicing operation. According to the present invention, however, the burn-in is performed after the dicing operation. Thus, any defective semiconductor chips generated in the dicing operation can be surely removed in burn-in screening, resulting in reduction of the number of inspections.

As the semiconductor wafer is fixed to the contactor after the dicing operation, each semiconductor chip can be fitted to the corresponding probe terminal of the contactor even if the probe terminals are different in height more or less. Hence, the contact between the probe terminal of the contactor and its corresponding test electrode of the semiconductor chip is ensured.

As the semiconductor wafer causes a sort of pseudo expansion by the heating operation inherent to the burn-in, it becomes possible to prevent the number of steps from increasing and to reduce the restrictions against an expensive contactor, bringing the merits of increasing the degree of freedom in the design of the contactor and of decreasing the costs.

In the above first inspecting method of a semiconductor device, it is desirable to further comprise a fifth step of performing a before-shipment inspection on each of said plural semiconductor chips subjected to said burn-in. By adding the fifth step, it becomes possible to ship perfect bare chips having passed the before-shipment inspection.

In the above first inspecting method of a semiconductor device, it is desirable to further comprise, between said second step and said third step, a step of judging whether each semiconductor chip is defective or not and removing said each semiconductor chip from the sheet when said each semiconductor is judged to be defective.

In so doing, the burn-in is applied to each semiconductor chip after any defective semiconductor chip is removed from the sheet. More specifically, after any semiconductor chip having caused power current failure or leak failure is removed from the sheet, the burn-in voltage can be stably applied to the perfect semiconductor chips only. Thus, it becomes possible to efficiently perform the burn-in on plural semiconductor chips in a batch manner.

In the above first inspecting method of a semiconductor device, it is desirable to further comprise, before said first step, a step of heating said sheet to contract said sheet.

In so doing, the sheet on which the semiconductor wafer is fixed can be contracted in advance. Hence, when the dicing operation is performed on the semiconductor, the sheet seldom generates a further contraction. This means that the dislocation between semiconductor chips can be suppressed even after the dicing operation.

In the above first inspecting method of a semiconductor device, it is desirable that said first step includes a step of fixing said sheet fixed to said semiconductor wafer on a substrate having substantially the same thermal expansion coefficient as that of said contactor.

With this step, the semiconductor wafer is fixed through the expandable sheet to the substrate having substantially the same thermal expansion coefficient as that of the contactor. Thus, when the semiconductor wafer fixed to the contactor is heated, the semiconductor wafer expands the same extent as the contactor; therefore, it becomes possible to suppress dislocation between each test electrode of the semiconductor chip and a corresponding probe terminal of the contactor.

In the above first inspecting method of a semiconductor device, it is desirable that said first step includes a step of fixing said sheet fixed to said semiconductor wafer on said substrate by a suction force. By doing so, it becomes possible to surely fix the semiconductor wafer to the substrate through the expandable sheet by the suction force.

In the above first inspecting method of a semiconductor device, it is desirable that said first step includes a step of fixing said sheet fixed to said semiconductor wafer on said substrate by a suction force acting from a suction hole formed in a specific region on said substrate where said suction hole does not confront with said test electrode formed on said semiconductor chip.

Through this step, the semiconductor chip is sucked on the substrate at the specific region where no test electrode is formed. In other words, it becomes possible to prevent the semiconductor chip from deflecting toward the contactor at the region where no test electrode is formed. Accordingly, the burn-in can be performed without causing any deflection of the semiconductor chip.

In the above first inspecting method of a semiconductor device, it is desirable to further comprise, before said first step, a step of providing protrusions on said contactor along a scribe line of said semiconductor wafer, wherein said third step includes a step of inserting said protrusions of said contactor into each gap between adjacent semiconductor chips, and said fourth step includes a step of expanding said gap between said adjacent semiconductor chips by utilizing thermal expansion of said protrusions which shift toward a peripheral edge of said contactor in response to thermal expansion of said contactor itself.

Through these steps, the protrusions are provided on the contactor at the region corresponding to the scribe line of the semiconductor wafer, and the semiconductor is heated under the condition where the protrusions are inserted into the gap between semiconductor chips. With this heating operation, the protrusions shift toward the peripheral edge of the contactor in response to the thermal expansion of the contactor itself, accompanied by expansion of the gap between semiconductor chips. Hence, it becomes possible to surely prevent any dislocation between each test electrode of the semiconductor chip and a corresponding probe terminal on the contactor even in the peripheral region of the semiconductor wafer. Furthermore, after finishing the heat-up operation of the semiconductor wafer, the contactor is cooled down to return the protrusions toward the central region of the contactor. Accordingly, the gap between semiconductor chips is reduced.

In the above first inspecting method of a semiconductor device, it is desirable to further comprise, before said first step, a step of providing probe terminals on said contactor being engageable with and arranged at a position corresponding to the test electrodes on said semiconductor chips, respectively, wherein said third step includes a step of coupling each probe terminal of said contactor with said corresponding test electrode of said semiconductor chip, and said fourth step includes a step of expanding said gap between said adjacent semiconductor chips by utilizing thermal expansion of said probe terminals which shift toward a peripheral edge of said contactor in response to thermal expansion of said contactor itself.

By these steps, each probe terminal is provided on the contactor at the position corresponding to a test electrode formed on each semiconductor chip, and the semiconductor wafer is heated up under the state that the probe terminals are respectively coupled with the test terminals of the semiconductor chips. With this heating operation, the probe terminals shift toward the peripheral edge of the contactor in response to the thermal expansion of the contactor itself, accompanied by expansion of the gap between semiconductor chips. Hence, it becomes possible to surely prevent any dislocation between each test electrode of the semiconductor chips and a corresponding probe terminal on the contactor even in the peripheral region of the semiconductor wafer. Furthermore, after finishing the heat-up operation of the semiconductor wafer, the contactor is cooled down to return the probe terminals toward the central region of the contactor. Accordingly, the gap between semiconductor chips is reduced.

To accomplish the previously described and other related objects, the present invention provides a second inspecting method for a semiconductor device, according to which a semiconductor wafer is applied to a dicing operation under the state that the semiconductor wafer is fixed to a substrate having substantially the same thermal expansion coefficient as that of a contactor so as to divide plural semiconductor chips, and then thermal expansion of the contactor is utilized to expand the gap between semiconductor chips, thereby causing a sort of pseudo expansion of semiconductor wafer.

More specifically, the second aspect of the present invention provides an inspecting method for a semiconductor device, comprising: a first step of fixing a semiconductor wafer on a substrate, said semiconductor wafer being formed with a plurality of semiconductor chips each having a test electrode, said substrate having substantially the same thermal expansion coefficient as that of a contactor which has probe terminals each supplying an electric signal to said test terminal of each semiconductor chip; a second step of dividing said plural semiconductor chips by dicing said semiconductor wafer fixed on said substrate without dividing said substrate; a third step of aligning said contactor against said semiconductor wafer subjected to said dicing operation, and by bringing said test electrode of each semiconductor chip into contact with a corresponding probe terminal of said contactor; and a fourth step of heating said semiconductor wafer fixed to said substrate so as to expand a gap between adjacent semiconductor chips in response to thermal expansion of said substrate, and then performing a burn-in on all of said plural semiconductor chips.

According to the above second inspecting method for a semiconductor device, when the semiconductor wafer comprising plural semiconductor chips divided is heated, the gap between semiconductor chips is expanded in response to the thermal expansion of the substrate because the semiconductor wafer is fixed to the substrate having substantially the same thermal expansion coefficient as that of the contactor, so as to realize the pseudo expansion of the semiconductor wafer. Hence, the burn-in is no longer bothered by dislocation generated between a test electrode of each semiconductor chip and a corresponding probe terminal of the contactor even in the peripheral region of the semiconductor wafer. Accordingly, the burn-in can be performed in a batch manner in the wafer state.

As well as the first inspecting method for a semiconductor device, any defective semiconductor chip generated in the dicing operation can be removed in the burn-in screening, resulting in the reduction of the number of inspections. Furthermore, as the semiconductor wafer causes a sort of pseudo expansion by the heating operation inherent to the burn-in, it becomes possible to prevent the number of steps from increasing and to reduce the restrictions against an expensive contactor, bringing the merits of increasing the degree of freedom in the design of the contactor and of decreasing the costs.

In the above second inspecting method of a semiconductor device, it is desirable to further comprise a fifth step of performing a before-shipment inspection on each of said plural semiconductor chips after finishing said burn-in. By the fifth step, it becomes possible to ship perfect bare chips having passed the before-shipment inspection.

In the above second inspecting method of a semiconductor device, it is desirable to further comprise, between said second step and said third step, a step of judging whether each semiconductor chip is defective or not and removing said each semiconductor chip when said each semiconductor is judged to be defective.

By adding this step, the burn-in is applied to each semiconductor chip after any defective semiconductor chip is removed. More specifically, after any semiconductor chip judged to have power current failure or leak failure is removed, the burn-in voltage can be stably applied to the perfect semiconductor chips only. Thus, it becomes possible to efficiently perform the burn-in on plural semiconductor chips in a batch manner.

In the above second inspecting method of a semiconductor device, it is desirable that said first step includes a step of fixing said semiconductor wafer on said substrate by bond.

By doing so, the gap between semiconductor chips is surely expanded in response to the thermal expansion of the substrate. Thus, no dislocation is generated between each test electrode of each semiconductor chip and its corresponding probe terminal of the contactor even in the peripheral region of the semiconductor wafer. Hence, it becomes possible to perform the burn-in in a batch manner in the wafer condition.

In the above second inspecting method of a semiconductor device, it is desirable that said first step includes a step of fixing said semiconductor wafer to said substrate, interposing an expandable sheet.

With this step, the dicing operation against the semiconductor wafer can be performed in such a manner that no kerf is formed on the substrate although a kerf may be formed in the sheet. In other words, the semiconductor chips can be divided without damaging the dicing blade. The expansibility of the sheet allows the sheet to expand in response to the thermal expansion of the contactor. Thus, the gap between semiconductor chips is surely expanded in response to the thermal expansion of the substrate even though the sheet is interposed between the semiconductor wafer and the substrate.

In the above second inspecting method of a semiconductor device, it is desirable that said first step includes a step of fixing said semiconductor wafer to said substrate by a suction force.

Through this step, the gap between the semiconductor chips is surely expanded in response to the thermal expansion of the substrate. In addition, when the suction operation to the semiconductor wafer is finished, the semiconductor wafer is easily released from the substrate. Therefore, it becomes possible to smoothly proceed to the next step.

In the above second inspecting method of a semiconductor device, it is desirable that said first step includes a step of interposing a porous sheet between said sheet and said substrate.

With this arrangement, through holes of the sheet can communicate with suction holes of the substrate through the porous sheet. The semiconductor chip can be surely fixed to the substrate by the suction force acting from the through holes of the sheet and the suction holes of the substrate.

In the above second inspecting method of a semiconductor device, it is desirable that said first step includes a step of fixing said semiconductor wafer to said substrate by a suction force acting from a suction hole formed in a specific region on said substrate where said suction hole does not confront with said test electrode formed on said semiconductor chip.

By this step, the semiconductor chip can be sucked on the substrate at the portion where no test electrode is formed. In other words, it becomes possible to prevent the semiconductor chip from deflecting toward the contactor at the region where no test electrode is formed. Accordingly, the burn-in can be performed without causing any deflection of the semiconductor chip.

In the above second inspecting method of a semiconductor device, it is desirable to further comprises, before said first step, a step of forming a plurality of suction holes on said substrate, and interposing a sheet between said semiconductor wafer and said substrate, said sheet having through holes respectively corresponding to said plural semiconductor chips, wherein said first step includes a step of fixing said semiconductor wafer to said substrate by a suction force acting from said through holes formed on said sheet and said suction holes of said substrate.

In so doing, each semiconductor chip can be fixed on the substrate by the suction force acting from the through holes of the sheet and the suction holes of the substrate. The gap between semiconductor chips can be expanded in response to the thermal expansion of the contactor or the substrate. Furthermore, the sheet having through holes is provided so as to correspond to the semiconductor wafer, and the substrate possesses generality, reducing the costs.

BRIEF DESCRIPTION OF THE DRAWINGS

FIG. 7 is a cross-sectional view showing a step of an inspecting method for a semiconductor device in accordance with a fourth embodiment of the present invention;

FIGS. 11(a) through 11(c) are cross-sectional views showing each step of an inspecting method for a semiconductor device in accordance with a seventh embodiment of the present invention;

DETAILED DESCRIPTION OF THE PREFERRED EMBODIMENTS

Hereinafter, an inspecting method for a semiconductor device in accordance with the first embodiment of the present invention will be described with reference to FIGS. 1(a) through 3(c).

Figure 1A:
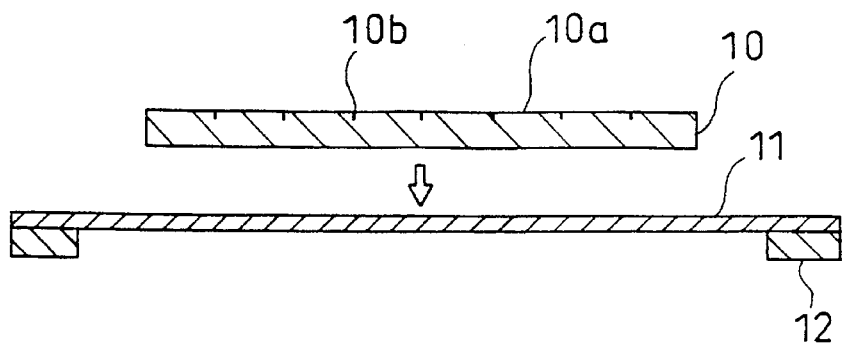
FIGS. 1(a) through 1(c) are cross-sectional views showing each step of an inspecting method for a semiconductor device in accordance with a first embodiment of the present invention.

First of all, as illustrated in FIG. 1(a), a semiconductor wafer 10 including numerous semiconductor chips 10a is fixed by an acrylic group or silicon group bond on a dicing sheet 11 having an appropriate expansibility which is subjected to a heat treatment in advance. The dicing sheet 11 would be about 50 µm thick and made of, for example, polyester, polyimide, polyolefine or vinyl chloride.

A typical heat treatment condition for dicing sheet 11 would be the condition by which dicing sheet 11 causes substantial contraction. For polyester dicing sheet 11, the heat treatment condition is nearly 10 minutes by 120° C. Through such a heat treatment, the dicing sheet 11 causes an approximately 0.4% contraction in the MD direction (i.e. a longitudinal direction in the rolling processing), and causes an approximately 0.2% contraction in the TD direction (i.e. a transverse direction in the rolling processing). With this heat treatment, internal stress caused in dicing sheet 11 in the rolling processing will be released.

The affixing condition for semiconductor wafer 10 is, for example, 2 to 3 minutes by the temperature of 40° to 60° C. The dicing sheet 11, as having a thin thickness, needs to be fixed by a rigid ring 12 at its peripheral edge to increase the rigidity thereof. In the following description, when the semiconductor wafer 10 is fixed to the dicing sheet 11 and the peripheral end of the dicing sheet 11 is affixed by the rigid ring 12, the assembly is referred to as a semiconductor wafer mounting sheet.

Figure 1B:
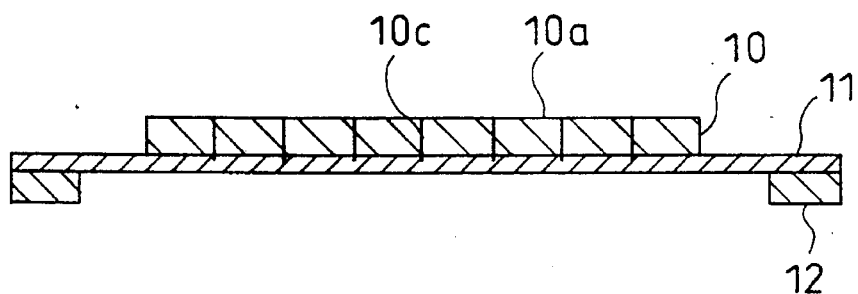

Next, as illustrated in FIG. 1(b), the semiconductor wafer 10 is diced along scribe line 10b, thereby forming kerfs 10c having, for example, a width of 50 µm to 100 µm between adjacent semiconductor chips 10a. In this case, the stroke of this dicing operation is as deep as forming a nearly 20 µm kerf in the dicing sheet 11.

The mutual position of adjacent semiconductor chips 10a is experimentally compared before and after the dicing operation, by using a dicing sheet subjected to the heat treatment beforehand and another dicing sheet not subjected to heat treatment. The dicing sheet subjected to the heat treatment has caused a 4 µm contraction per 95.4 mm in the MD direction, and also caused a 10 µm expansion per 123.9 mm in the TD direction. On the other hand, the dicing sheet not subjected to heat treatment has caused a 26 µm contraction per 95.4 mm in the TD direction, and caused a 55 µm expansion per 123.9 mm in the MD direction. From these experimental results, it is confirmed that the dicing sheet subjected to the heat treatment beforehand causes a less contraction after the dicing operation.

On the other hand, a judgement is made as to whether each semiconductor chip is defective or not by using a semiconductor tester or the like. If a semiconductor chip 10a is judged to be defective, this defective semiconductor chip 10a is removed from the dicing sheet 11. Through this step, any semiconductor chip 10a having caused power current failure or leak failure is removed. Thus, it becomes possible to stably apply a burn-in voltage to each semiconductor chip 10a.

Figure 1C:
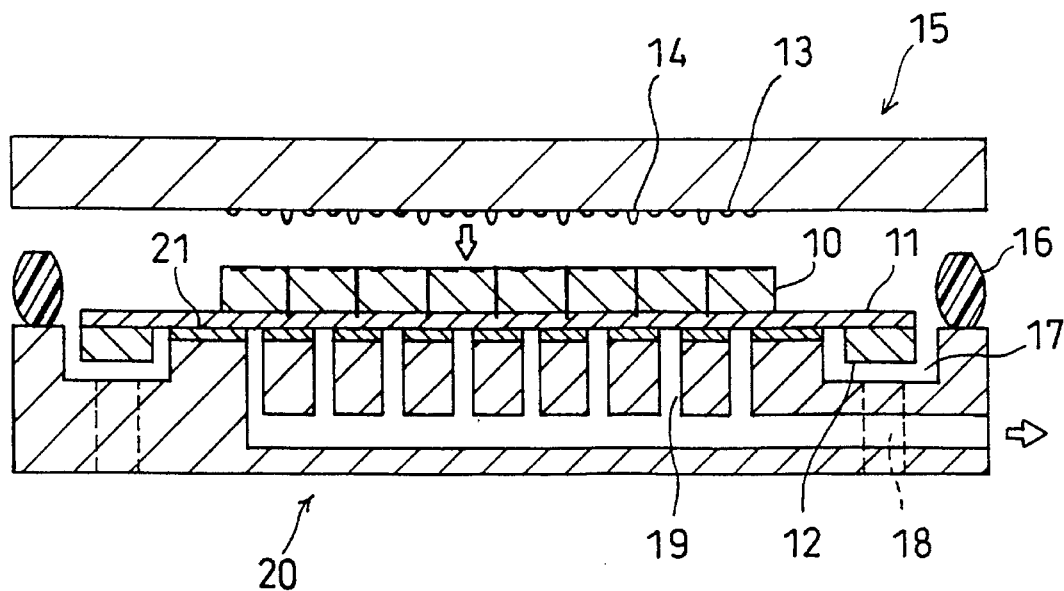

Subsequently, as illustrated in FIG. 1(c), there is prepared a contactor 15 having numerous bumps 13 each serving as a probe terminal which is positioned so as to confront with a corresponding test electrode formed on each semiconductor chip 10a. The contactor 15 further has protrusions 14 each being longer than the bump 13 and being positioned so as to confront with the scribe line 10b. Furthermore, there is prepared a burn-in substrate 20 which has a seal packing member 16 at the peripheral edge thereof, a ring-shaped groove 17 and a contactor suction hole 18 communicating with each other and formed in the peripheral region, and a concentric wafer suction hole 19 formed in the central region thereof. A packing sheet 21 made of silicone rubber is placed on the burn-in substrate 20, and the semiconductor wafer 10 is mounted on the packing sheet 21. Then, the semiconductor wafer 10 is fixed on the burn-in substrate 20 by the suction force of approximately ¼ atmosphere from the wafer suction hole 19.

Figure 2A:
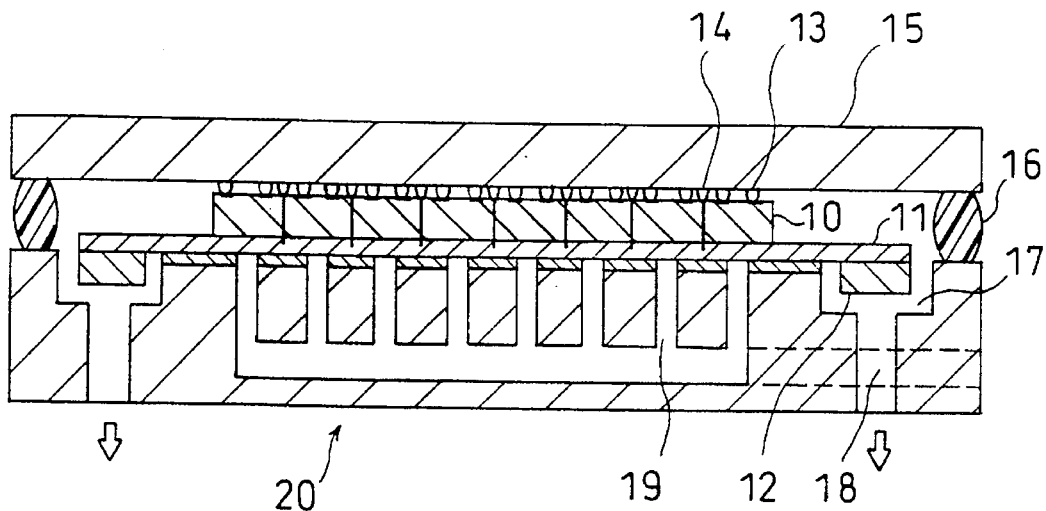
FIGS. 2(a) through 2(c) are cross-sectional views showing each step of the inspecting method for a semiconductor device in accordance with the first embodiment.
Figure 3A:
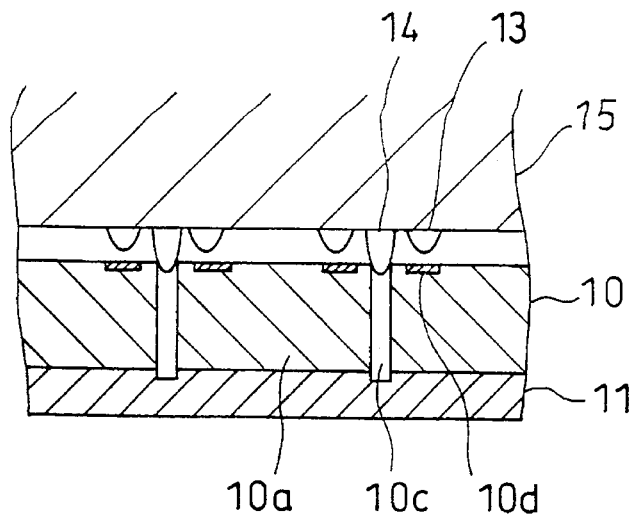
FIGS. 3(a) through 3(c) are cross-sectional views showing each step of the inspecting method for a semiconductor device in accordance with the first embodiment.

Next, as illustrated in FIG. 2(a), the contactor 15 is mounted on the packing member 16. In this case, as a result of alignment of semiconductor wafer 10 against contactor 15, each protrusion 14 of the contactor 15 is inserted in a corresponding kerf 10c formed between adjacent semiconductor chips 10a as shown in FIG. 3(a). Meanwhile, each bump 13 of the contactor 15 is spaced in a confronting manner from a corresponding test electrode 10d formed on the semiconductor chip 10a. Thereafter, the space defined by contactor 15, burn-in substrate 20 and packing member 16 is vacuumized through the contactor suction hole 18. With this vacuuming operation, the contactor 15 and the burn-in substrate 20 are brought into a closer relation. Thus, the semiconductor wafer 10 is fixed to the contactor 15. Each bump 13 of the contactor 15 is directly brought into contact with a corresponding test electrode 10d of the semiconductor chip 10a, thereby establishing an electrical path therebetween.

Figure 3B:
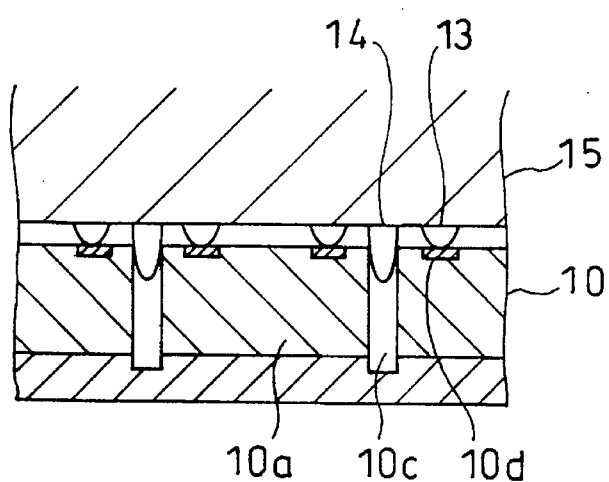

Next, semiconductor wafer 10 is heated up to, for example, 125° C. by entering it into an oven together with contactor 15 and burn-in substrate 20, or by turning on a heater (not shown) provided in burn-in substrate 20. Through this heat-up operation, contactor 15 is also heated up and thermally expanded. Each projection 14 expands so as to shift toward the peripheral edge of the contactor 15. With this thermal expansion, each projection 14 enters deeply into kerf 10c and, therefore, the width of kerf 10c is enlarged, as shown in FIG. 3(b). In this manner, the gap between adjacent semiconductor chips 10a is expanded. Thus, the semiconductor 10 causes a sort of pseudo expansion. In this case, dicing sheet 11 has the expansibility sufficiently large to cause a self expansion in response to the expansion of semiconductor wafer 10. Hence, even in the peripheral region of semiconductor wafer 10, no dislocation is found between bumps 13 of contactor 15 and the corresponding test electrodes 10d of semiconductor wafer 10. Keeping this state, the burn-in is performed on each semiconductor chip 10a at the temperature of, for example, 125° C.

Figure 3C:
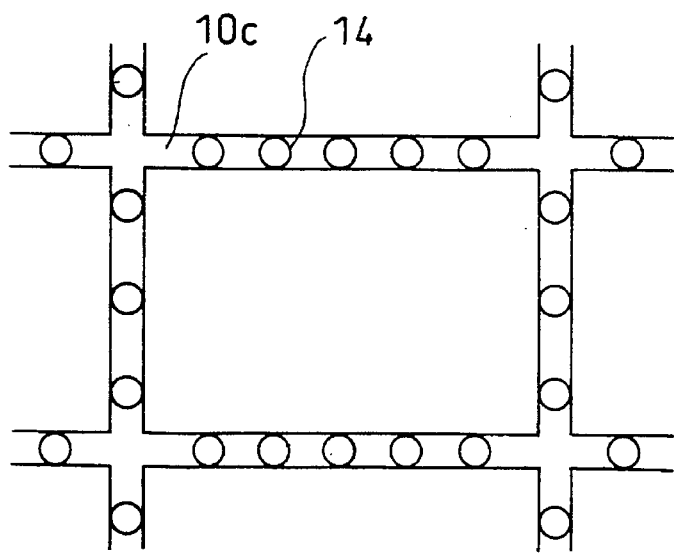

Although the number of protrusions 14 is not specifically limited, it will be desirable to provide a plurality of protrusions 14 along each side of semiconductor chip 10a as shown in FIG. 3(c) since the gap of adjacent semiconductor chips 10a is surely expanded in accordance with thermal expansion of contactor 15. Also, the gap of adjacent semiconductor chips 10a is surely decreased in accordance with thermal contraction of contactor 15, restoring the original size of semiconductor wafer 10.

Figure 2B:
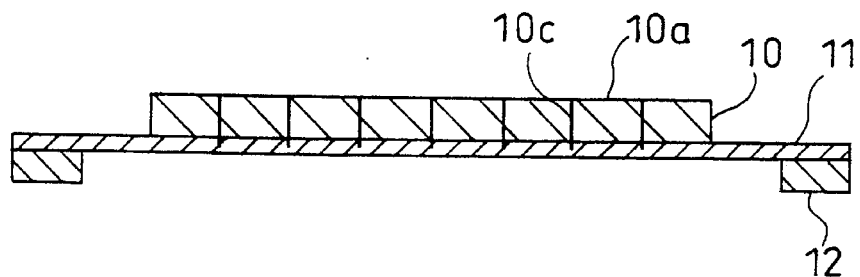

After the burn-in to each semiconductor chip 10a, semiconductor wafer 10 is cooled down to restore its original size. Then, as illustrated in FIG. 2(b), semiconductor wafer 10 is removed from burn-in substrate 20. Thereafter, each semiconductor chip 10a is subjected to a before-shipment inspection.

Figure 2C:
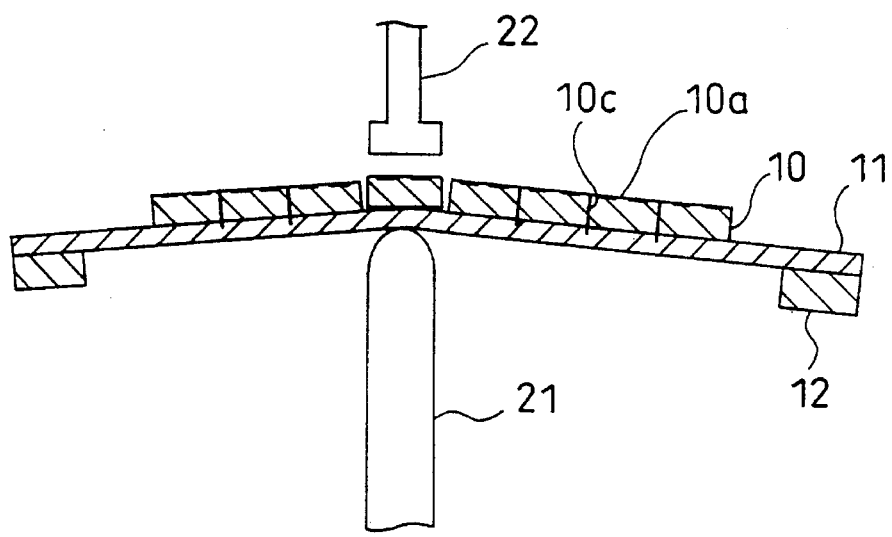

Next, the adhesive force of the bond connecting semiconductor wafer 10 and dicing sheet 11 is reduced by keeping semiconductor wafer 10 in the atmosphere of the temperature of, for example, 160° C. for about 1 minute or by irradiating ultraviolet ray on semiconductor wafer 10. Then, as illustrated in FIG. 2(c), each semiconductor chip 10a is pushed up by a pushing pin 21, thereby removing the semiconductor chip 10a from dicing sheet 11. The semiconductor chip 10a, after having been removed from the dicing sheet 11, is conveyed to a predetermined storage by a collet 22.

Hereinafter, an inspecting method for a semiconductor device in accordance with the second embodiment of the present invention will be discussed with reference to FIGS. 4(a) and 4(b).

The second embodiment is characterized in that each bump 13 of contactor 15, instead of projections 14, is used to expand the gap between adjacent semiconductor chips 10a.

Figure 4A:
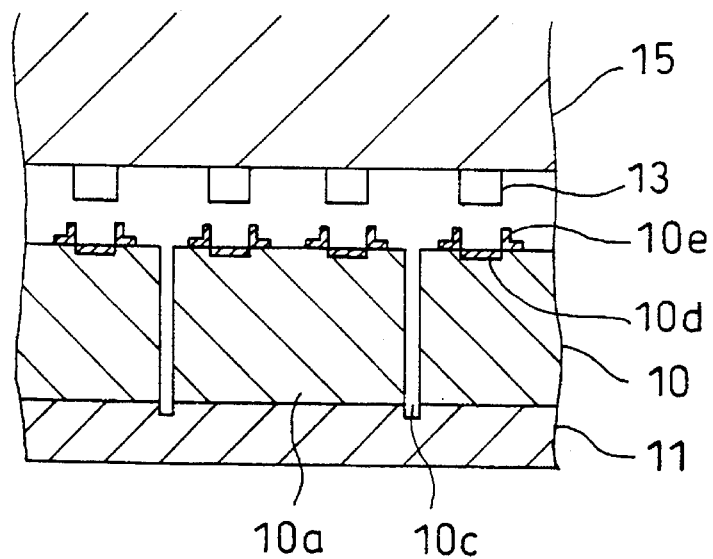
FIGS. 4(a) and 4(b) are cross-sectional views showing each step of an inspecting method for a semiconductor device in accordance with a second embodiment of the present invention.
Figure 4B:
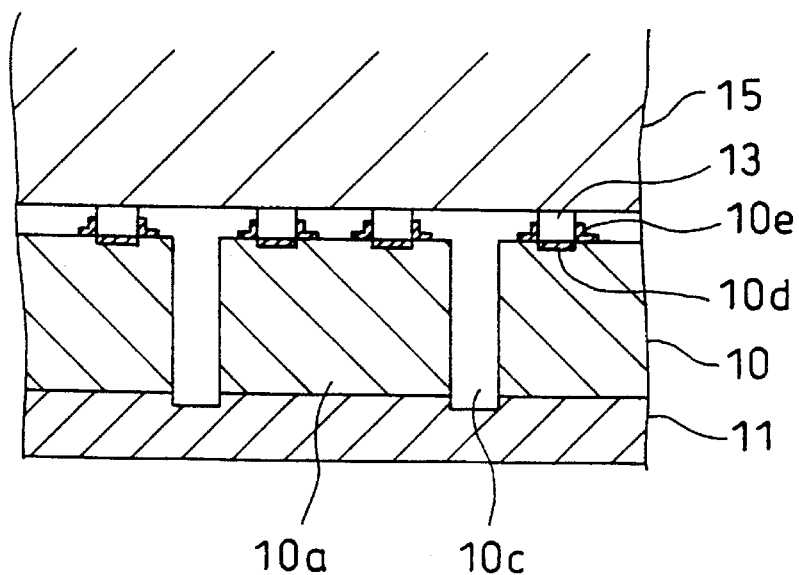

First of all, as illustrated in FIG. 4(a), each bump 13 is configured into a column or prism, while each test electrode 10d is configured into a shape coupled with a corresponding bump 13. For example, the peripheral end of each test electrode 10d is provided around the contact area and is formed into L shape in a cross section. After semiconductor wafer 10 is aligned against contactor 15, semiconductor wafer 10 is fixed with contactor 15 so that each bump 13 is coupled with the corresponding test electrode 10d.

Keeping this state, semiconductor wafer 10 is heated up. Each bump 13 expands toward the peripheral edge in response to thermal expansion of contactor 15. As shown in FIG. 4(b), the width of kerf 10c between adjacent semiconductor chips 10a is enlarged. Thus, the semiconductor wafer 10 causes a sort of pseudo expansion.

Figure 5A:
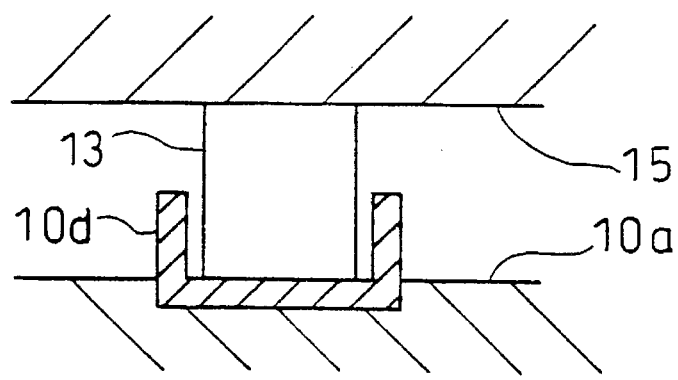
FIGS. 5(a) and 5(b) are cross-sectional views respectively showing modified examples of a pad of the contactor and a test electrode of the semiconductor chip in the inspecting method for a semiconductor device in accordance with the second embodiment.
Figure 5B:
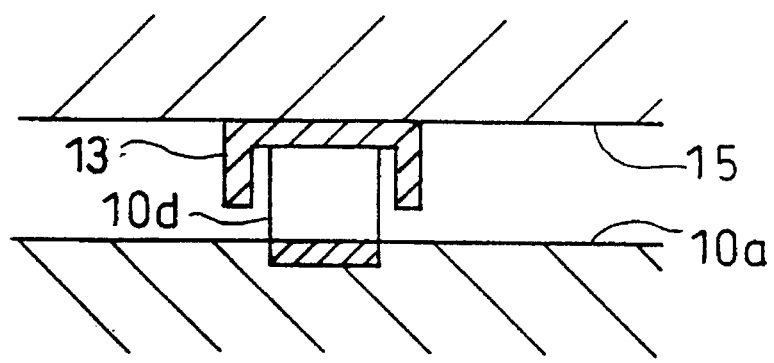

FIGS. 5(a) and 5(b) show modified examples of bump 13 of contactor 15 and test electrode 10d of semiconductor chip 10a. More specifically, as shown in FIG. 5(a), each bump 13 may be configured into a column or prism while each test electrode 10d be a circular or polygonal cylinder having a bottom. Alternatively, as shown in FIG. 5(b), each bump 13 may be configured into a circular or polygonal cylinder having a bottom while each test electrode 10d be configured into a column or prism.

Hereinafter, an inspecting method for a semiconductor device in accordance with the third embodiment of the present invention will be discussed with reference to FIGS. 6(a) through 6(c).

Figure 6A:
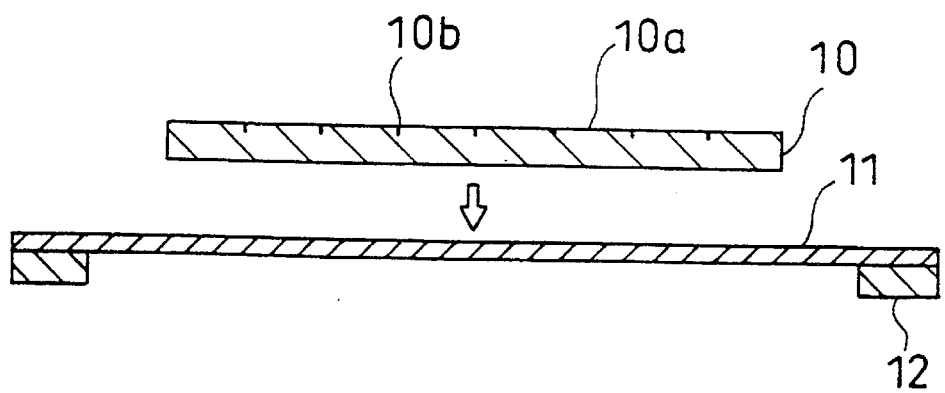
FIGS. 6(a) through 6(c) are cross-sectional views showing each step of an inspecting method for a semiconductor device in accordance with a third embodiment of the present invention.

First of all, as illustrated in FIG. 6(a), semiconductor wafer 10 is fixed by an acrylic group or silicon group bond on dicing sheet 11, as well as in the first embodiment. Then, dicing sheet 11 is affixed to the rigid ring 12 at the peripheral region thereof.

Figure 6B:
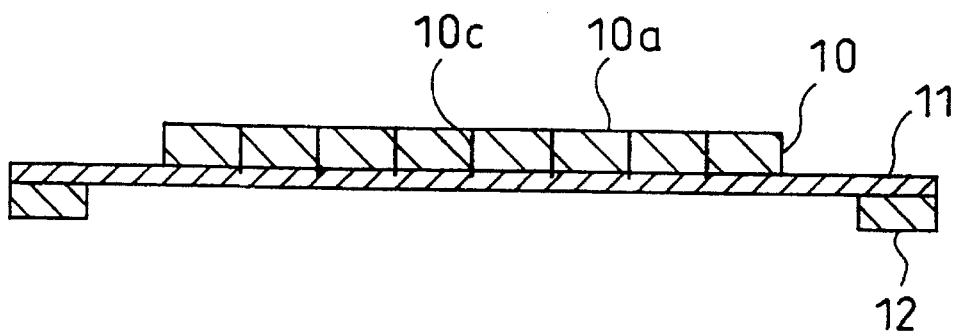

Next, as illustrated in FIG. 6(b), the dicing operation is performed on the semiconductor wafer 10 and any semiconductor chip 10a judged to be defective is removed, as well as in the first embodiment.

Figure 6C:
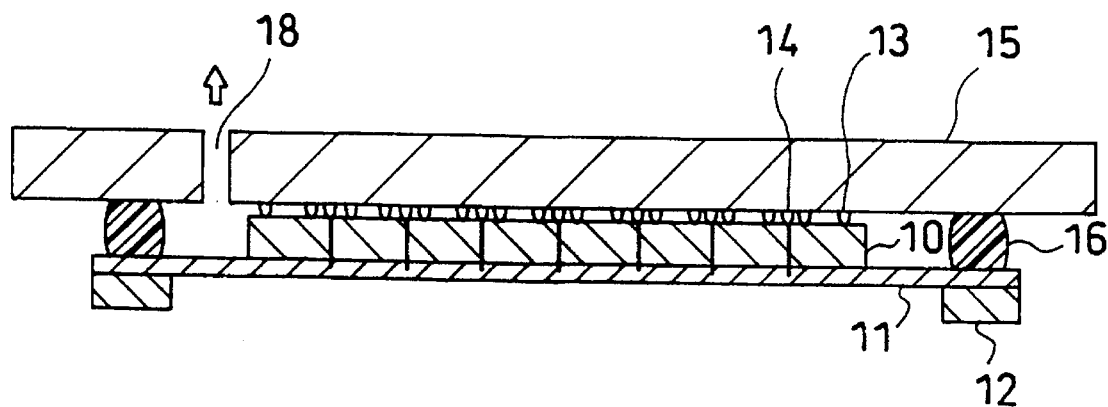
Figure 8A:
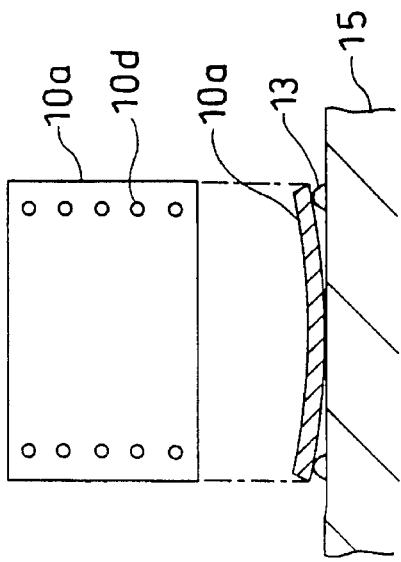
FIGS. 8(a) through 8(d) are cross-sectional views showing problems in the inspecting method for a semiconductor device in accordance with the fourth embodiment of the present invention.
Figure 8B:
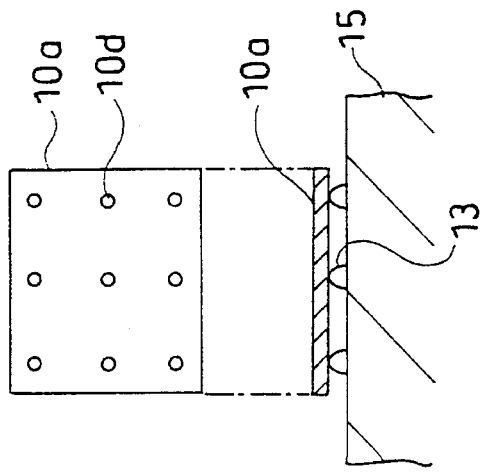
Figure 8C:
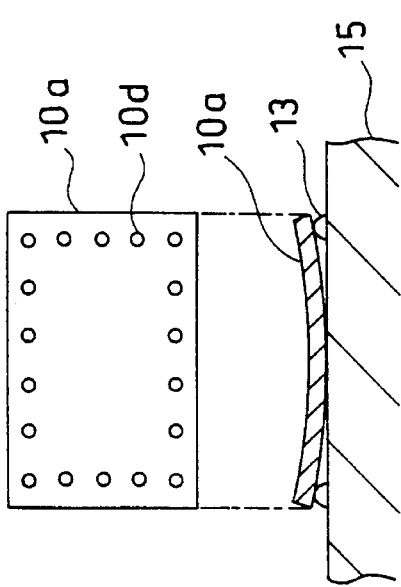
Figure 8D:
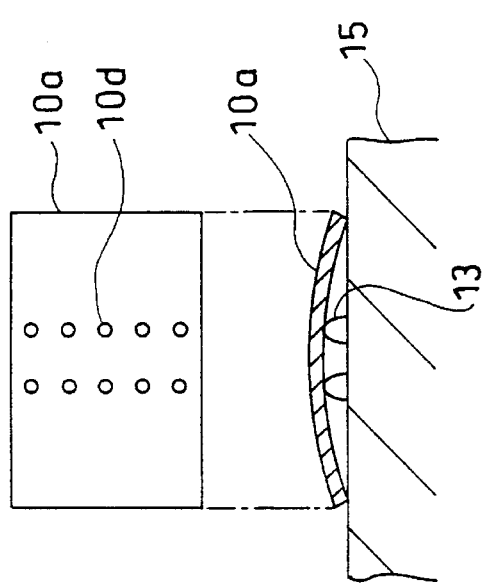

Subsequently, as illustrated in FIG. 6(c), there is prepared a contactor 15 having numerous bumps 13 each serving as a probe terminal which is positioned so as to confront with a corresponding test electrode 10d formed on the semiconductor chip 10a. The contactor 15 has a contactor suction hole 18 for sucking the semiconductor wafer mounting sheet. A ring-shaped packing member 16, provided on one of confronting faces of contactor 15 and rigid ring 12 of semiconductor wafer mounting sheet, seals the space defined by contactor 15 and semiconductor wafer mounting sheet. According to the third embodiment, packing member 16 is provided on the semiconductor wafer mounting sheet at the region corresponding to rigid ring 12.

Next, contactor 15 is mounted on packing member 16. In this case, as a result of alignment of semiconductor wafer 10 and contactor 15, each bump 13 of contactor 15 is spaced in a confronting manner from a corresponding test electrode 10d formed on semiconductor chip 10a, although this state is not shown in the drawing.

Thereafter, the space defined by contactor 15, semiconductor wafer mounting sheet and packing member 16 is vacuumized through the contactor suction hole 18. With this vacuuming operation, contactor 15 and semiconductor wafer mounting sheet are brought into a closer relation. Thus, the semiconductor wafer 10 is fixed to the contactor 15.

As discussed above, according to the third embodiment, it becomes possible to omit the burn-in substrate 20 used in the first and second embodiments.

Next, the burn-in and the before-shipment inspection are conducted in the same manner as the first embodiment.

Hereinafter, an inspecting method for a semiconductor device in accordance with the fourth embodiment of the present invention will be described with reference to FIG. 7.

First of all, as well as in the first embodiment, semiconductor wafer 10 is fixed by an acrylic group or silicon group bond on dicing sheet 11. The dicing sheet 11 is affixed to the rigid ring 12 at the peripheral region thereof. Thereafter, the dicing operation is performed on each semiconductor wafer 10 and any semiconductor chip 10a judged to be defective is removed.

Subsequently, as illustrated in FIG. 7, there is prepared a wafer fixing substrate 30 having numerous suction holes 27 each being provided in the portion not overlapping with each test electrode 10d formed on semiconductor chip 10a. These suction holes 27 are communicated with each other through a hollow space 28. After the semiconductor wafer sheet is mounted on wafer fixing substrate 30, the pressure of hollow space 28 is reduced so as to generate a suction force from each suction hole 27, by which semiconductor wafer 10 is firmly fixed to wafer fixing substrate 30. The reason why semiconductor wafer 10 is fixed on wafer fixing substrate 30 is as follows. Namely, according to the third embodiment, semiconductor wafer 10 is fixed on contactor 15 by reducing the pressure in the hollow space defined by contactor 15, semiconductor wafer mounting sheet and packing member 16. However, due to the expansibility of dicing sheet 11, there is the possibility that semiconductor chip 10a is deflected in such a fashion that bump 13 of contactor 15 contacting with test electrode 10d of semiconductor chip 10a serves as a supporting point for deflection as shown in FIGS. 8(a) through 8(d). To eliminate this kind of deflection of semiconductor chip 10a, the semiconductor wafer 10 needs to be fixed on wafer fixing substrate 30.

Next, as well as in the third embodiment, packing member 16 is mounted on contactor 15. Then, semiconductor wafer 10 and contactor 15 are aligned. Thereafter, the space defined by contactor 15, semiconductor wafer mounting sheet and packing member 16 is vacuumized. With this vacuuming operation, contactor 15 and semiconductor wafer mounting sheet are brought into a closer relation. Thus, the semiconductor wafer 10 is fixed to the contactor 15. In this case, it is desirable to equalize a suction force acting from contactor suction hole 18 of contactor 15 with a suction force acting from suction hole 27 of wafer fixing substrate 30, in order to avoid the deflection of semiconductor chip 10a.

Next, the burn-in and the before-shipment inspection are conducted in the same manner as the first embodiment.

Hereinafter, an inspecting method for a semiconductor device in accordance with the fifth embodiment of the present invention will be discussed with reference to FIGS. 9(a) through 9(c).

Figure 9A:
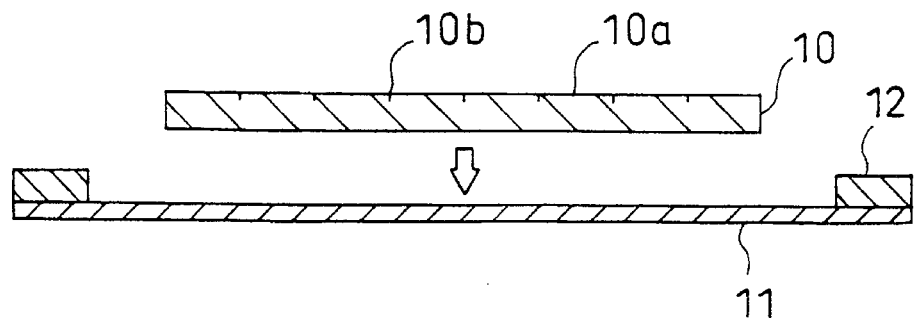
FIGS. 9(a) through 9(c) are cross-sectional views showing each step of an inspecting method for a semiconductor device in accordance with a fifth embodiment of the present invention.

First of all, as illustrated in FIG. 9(a), semiconductor wafer 10 is fixed by an acrylic group or silicon group bond on dicing sheet 11 as well as in the first embodiment. The dicing sheet 11 is affixed to the rigid ring 12 at the peripheral region thereof.

Figure 9B:
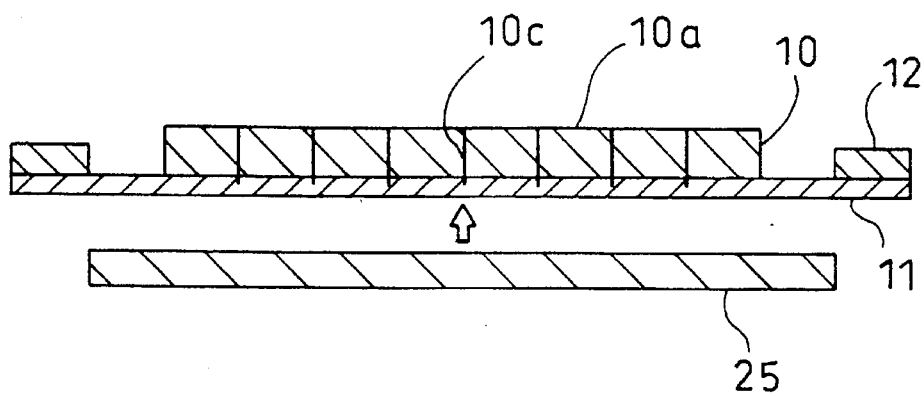
Figure 9C:
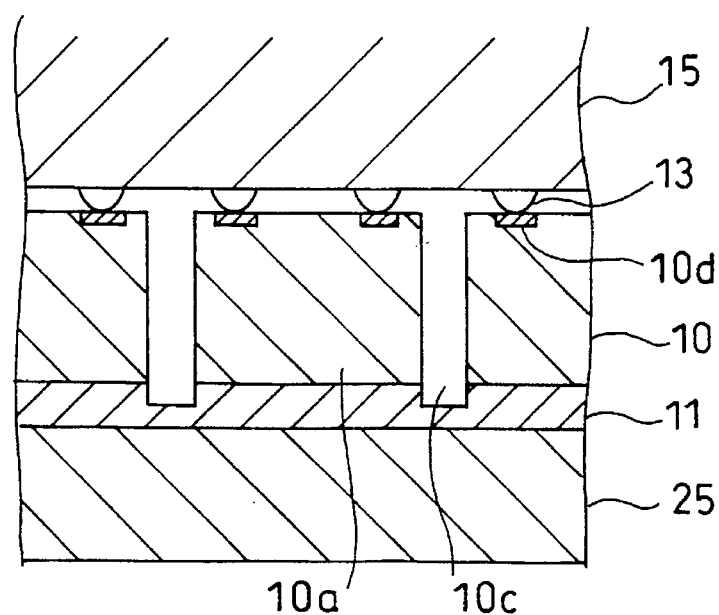

Next, as illustrated in FIG. 9(b), a rigid substrate 25 is affixed to a surface of dicing sheet 11 on which semiconductor wafer 10 is not affixed. This rigid substrate 25 is made of material having substantially the same thermal expansion coefficient as that of the contactor. Thus, dicing sheet 11 and rigid substrate 25 are firmly fixed. Meanwhile, instead of affixing rigid substrate 25 and dicing sheet 11 by bond, it will be possible to tightly connect dicing sheet 11 and rigid substrate 25 by a suction force of nearly ¼ atmosphere by providing a suction hole in the rigid substrate 25 in the same manner as the first embodiment.

Next, semiconductor wafer 10 is diced along scribe line 10b, thereby forming kerfs 10c between adjacent semiconductor chips 10a. In this case, the stroke of this dicing operation is as deep as forming a nearly 20 μm kerf in the dicing sheet 11. By doing so, it becomes possible to prevent the dicing blade from being damaged by the collision with rigid substrate 25.

Keeping this state, semiconductor wafer 10 is heated up to, for example, 125° C. by entering it into an oven together with contactor 15. Through this heat-up operation, rigid substrate 25 expands to the same extent as contactor 15. Hence, as illustrated in FIG. 9(c), the width of each kerf 10c of semiconductor wafer 10 is enlarged, and the gap between adjacent semiconductor chips 10a is also enlarged. Thus, the semiconductor 10 causes a sort of pseudo expansion. In this case, dicing sheet 11 has the expansibility sufficiently large to cause a self expansion in response to the expansion of rigid substrate 25. Hence, even in the peripheral region of semiconductor wafer 10, no dislocation is found between bumps 13 of contactor 15 and test electrodes 10d of semiconductor wafer 10. Keeping this state, the burn-in is performed on each semiconductor chip 10a at the temperature of, for example, 125° C. in a batch manner.

After the burn-in against each semiconductor chip 10a is finished, semiconductor wafer 10 is cooled down to restore its original size. Thereafter, each semiconductor chip 10a is subjected to a before-shipment inspection.

Regarding the configuration of rigid substrate 25 according to the fifth embodiment, it will be a plate, or a ring supporting the peripheral region of dicing sheet 11.

Hereinafter, an inspecting method for a semiconductor device in accordance with the sixth embodiment of the present invention will be described with reference to FIGS. 10(a) through 10(c).

Figure 10A:
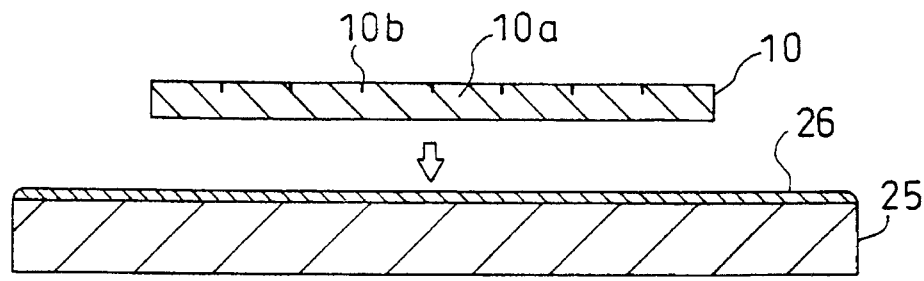
FIGS. 10(a) through 10(c) are cross-sectional views showing each step of an inspecting method for a semiconductor device in accordance with a sixth embodiment of the present invention.
Figure 10B:
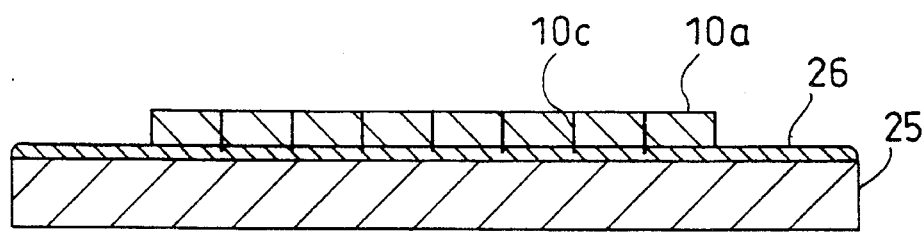
Figure 10C:
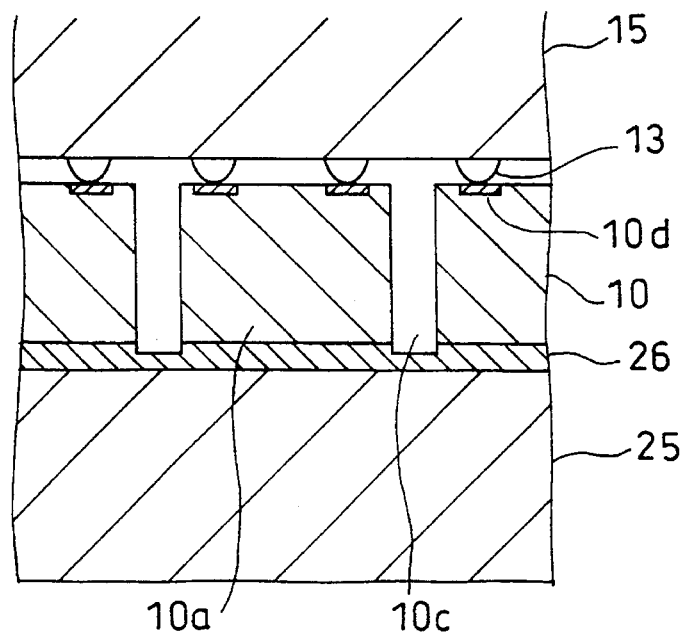

First of all, as illustrated in FIGS. 10(a) and 10(b), semiconductor wafer 10 is affixed on rigid substrate 25 through an adhesive sheet 26. The rigid substrate 25 is made of material having substantially the same thermal expansion coefficient as that of the previously-described contactor. In other words, the fifth embodiment is different from the fourth embodiment in that dicing sheet 11 is omitted. Omission of flexible dicing sheet 11 allows to omit rigid ring 12 too. Thereafter, semiconductor wafer 10 is diced along scribe line 10b, thereby forming kerfs 10c between adjacent semiconductor chips 10a. In this case, the stroke of this dicing operation is as deep as forming a nearly 20 μm kerf in the adhesive sheet 26. By doing so, it becomes possible to prevent the dicing blade from being damaged by the collision with rigid substrate 25.

Keeping this state, semiconductor wafer 10 is heated up to, for example, 125° C. by entering it into an oven together with contactor 15. Through this heat-up operation, rigid substrate 25 expands to the same extent as contactor 15. Hence, as illustrated in FIG. 10(c), the width of each kerf 10c of semiconductor wafer 10 is enlarged, and the gap between adjacent semiconductor chips 10a is also enlarged. Thus, the semiconductor 10 causes a sort of pseudo expansion. With this arrangement, even in the peripheral region of semiconductor wafer 10, no dislocation is found between bumps 13 of contactor 15 and test electrodes 10d of semiconductor wafer 10. Keeping this state, the burn-in is performed on each semiconductor chip 10a at the temperature of, for example, 125° C. in a batch manner.

After the burn-in to each semiconductor chip 10a is finished, semiconductor wafer 10 is cooled down to restore its original size. Thereafter, each semiconductor chip 10a is subjected to a before-shipment inspection.

Hereinafter, an inspecting method for a semiconductor device in accordance with the seventh embodiment of the present invention will be discussed with reference to FIGS. 11(a) through 12.

Figure 12:
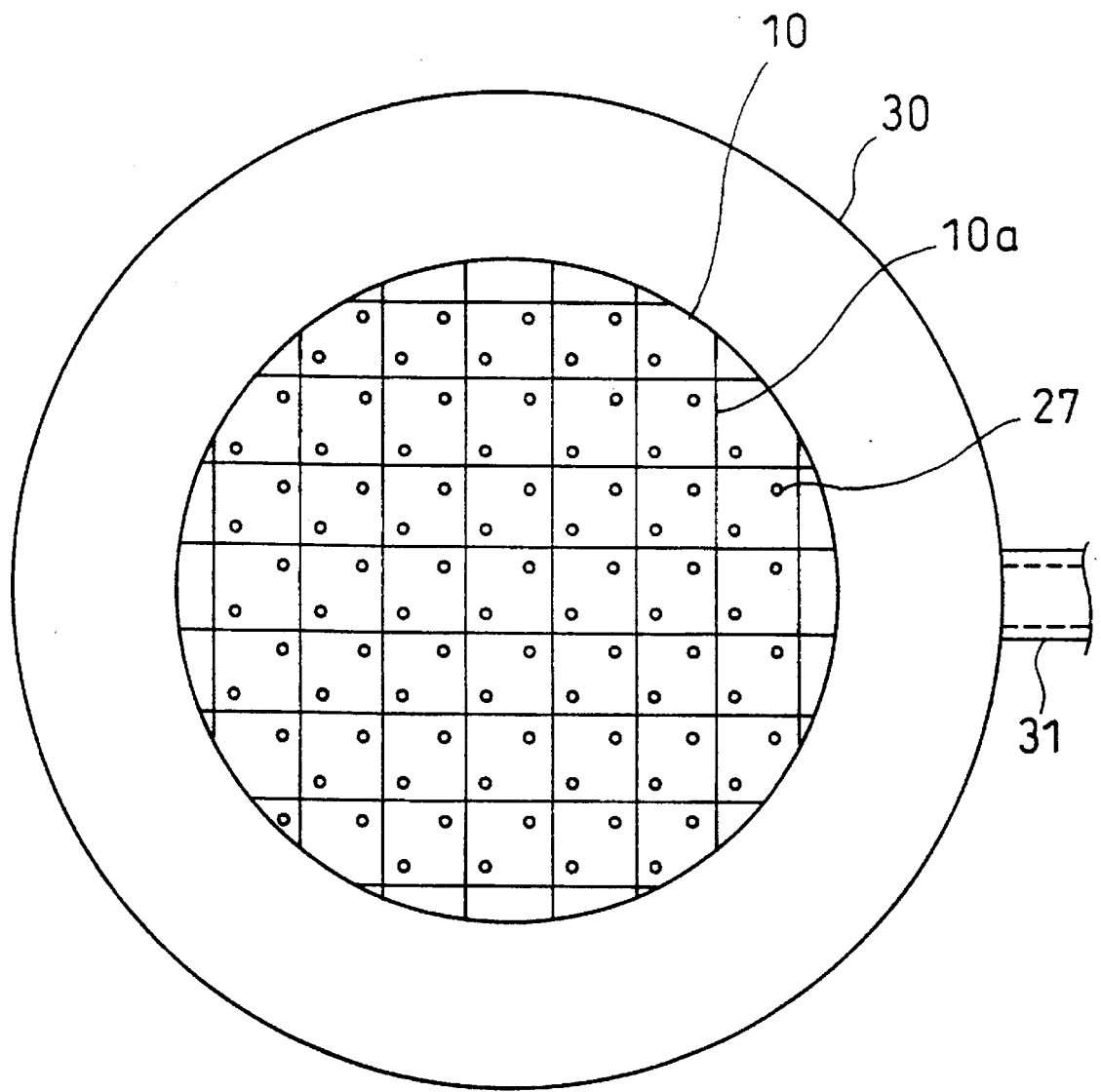
FIG. 12 is a plan view showing a substrate for fixing a wafer used in the inspecting method for a semiconductor device in accordance with the seventh embodiment.

First of all, as illustrated in FIGS. 11(a) and 12, there is prepared a wafer fixing substrate 30 made of material having substantially the same thermal expansion coefficient as that of the previously-described contactor, and configured into a shape larger than semiconductor wafer 10. The wafer fixing substrate 30 has numerous suction holes 27 each being positioned so as to meet with a corresponding semiconductor chip 10a, and a hollow space 28 formed therein for connecting these suction holes 27. Furthermore, the wafer fixing substrate 30 has a suction hole 31 provided at the peripheral region thereof, and communicating with hollow space 28 for reducing the pressure of the hollow space 28. Thereafter, semiconductor wafer 10 is mounted on wafer fixing substrate 30 through permeable sheet 32 having adequate expansibility.

Next, as illustrated in FIG. 11(b), the pressure in hollow space 28 is reduced through suction hole 31 so that semiconductor wafer 10 is firmly fixed on wafer fixing substrate 30 by a suction force acting from suction hole 27. Thereafter, semiconductor wafer 10 is diced along scribe line 10b, thereby forming kerfs 10c between adjacent semiconductor chips 10a. In this case, the stroke of this dicing operation is as deep as forming a nearly 20 μm kerf in the permeable sheet 32. By doing so, it becomes possible to prevent the dicing blade from being damaged by the collision with wafer fixing substrate 30.

Keeping this state, semiconductor wafer 10 is heated up to, for example, 125° C. by entering it into an oven together with wafer fixing substrate 30. Through this heat-up operation, wafer fixing substrate 30 expands to the same extent as contactor 15. Hence, as illustrated in FIG. 11(c), the width of each kerf 10c of semiconductor wafer 10 is enlarged, and the gap between adjacent semiconductor chips 10a is also enlarged. Thus, the semiconductor 10 causes a sort of pseudo expansion. Keeping this state, the burn-in is performed on each semiconductor chip 10a at the temperature of, for example, 125° C. in a batch manner.

After the burn-in against each semiconductor chip 10a is finished, semiconductor wafer 10 is cooled down to restore its original size. Thereafter, each semiconductor chip 10a is subjected to a before-shipment inspection.

Figure 13:
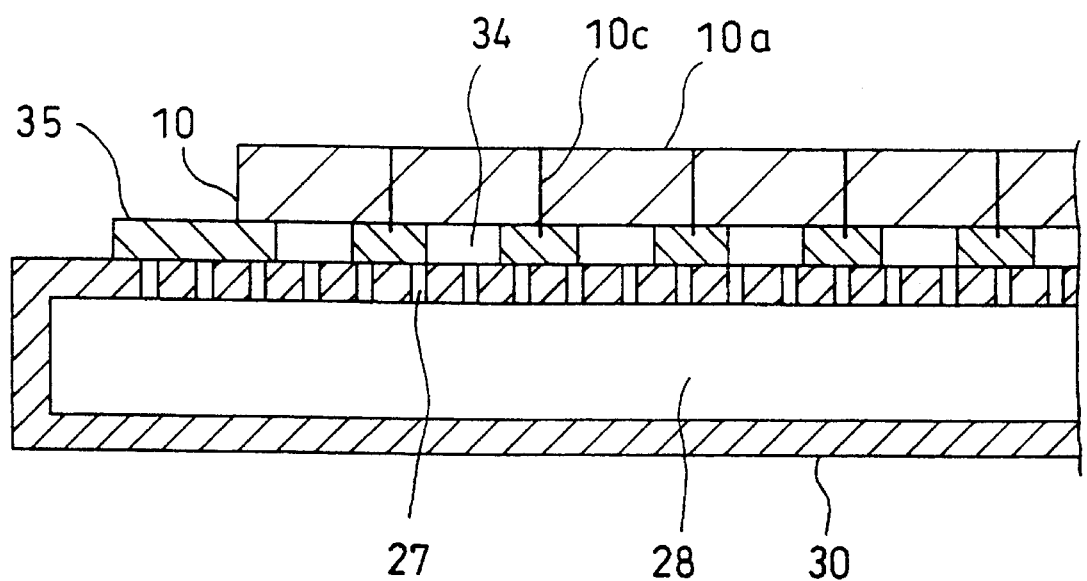
FIG. 13 is a cross-sectional view showing a step of an inspecting method for a semiconductor device in accordance with an eighth embodiment of the present invention.

Hereinafter, an inspecting method for a semiconductor device in accordance with the eighth embodiment of the present invention will be described with reference to FIG. 13.

The eighth embodiment is different from the seventh embodiment in that wafer fixing substrate 30 is provided with numerous suction holes 27 arranged in matrix irrespective of largeness and position of each semiconductor chip 10a and that a communicating sheet 35 having through holes 34 each having a relatively large diameter is interposed between semiconductor wafer 10 and wafer fixing substrate 30 so as to meet with a corresponding semiconductor chip 10a. Providing numerous suction holes 27 on wafer fixing substrate 30 and larger-diameter through holes 34 on communicating sheet 35 makes it possible to let each through hole 34 communicate with at least one suction hole 27. With this arrangement, semiconductor wafer 10 is firmly fixed to wafer fixing substrate 30 by a suction force acting from suction holes 27 formed in wafer fixing substrate 30 and through holes 34 formed in communicating sheet 35. The description for the burn-in for semiconductor wafer 10 is omitted in this eighth embodiment, since it is substantially the same as the seventh embodiment.

According to the eighth embodiment, it is only necessary to provide communicating sheet 35 so as to correspond to semiconductor wafer 10. Thus, it is possible to let wafer fixing substrate 30 possess generality, reducing the costs.

Figure 14:
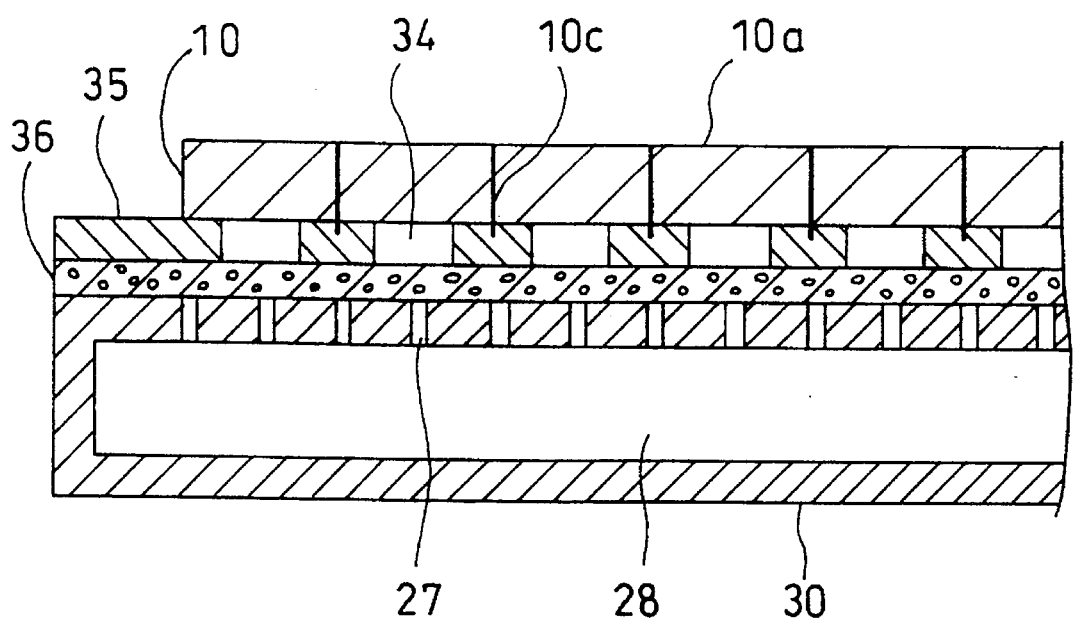
FIG. 14 is a cross-sectional view showing a step of an inspecting method for a semiconductor device in accordance with a ninth embodiment of the present invention.
Figure 15A:
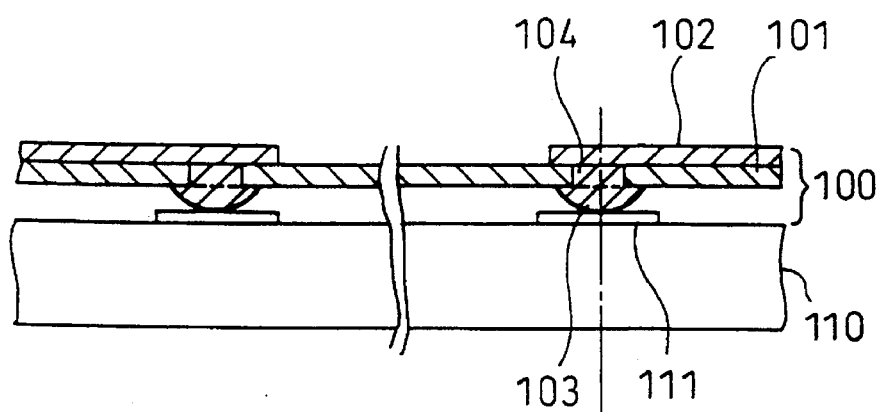
FIGS. 15(a) and 15(b) are cross-sectional views showing the conventional inspecting method for semiconductor devices and the problem of the same.
Figure 15B:
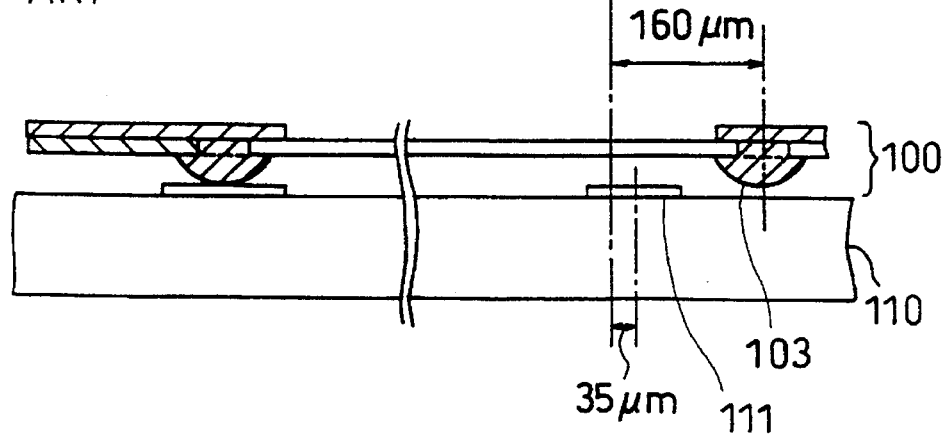

Hereinafter, an inspecting method for a semiconductor device in accordance with the ninth embodiment of the present invention will be described with reference to FIG. 14.

The ninth embodiment is different from the eighth embodiment in that a porous sheet 36 is interposed between communicating sheet 35 and wafer fixing substrate 30. With this arrangement, through holes 34 of communicating sheet 35 can communicate with many suction holes 27 other than the confronting suction hole 27 through this porous sheet 36. Hence, a suction force acting on wafer fixing substrate 30 is increased. Fixation of semiconductor wafer 10a onto wafer fixing substrate 30 is further ensured. The description for the burn-in for semiconductor wafer 10 is omitted in this ninth embodiment, since it is substantially the same as the seventh embodiment.

What is claimed is:

1. An inspecting method for a semiconductor device, comprising:

a first step of fixing a semiconductor wafer on an expandable sheet, said semiconductor wafer being formed with a plurality of semiconductor chips each having a test electrode;

a second step of dividing said plural semiconductor chips from each other by dicing said semiconductor wafer fixed on said sheet without dividing said sheet;

a third step of aligning a contactor for supplying an electric signal to said test electrode of each semiconductor chip against said semiconductor wafer after performing said dicing operation, and fixing said semiconductor wafer to said contactor; and a fourth step of heating said semiconductor wafer fixed to said contactor so as to expand a gap between adjacent semiconductor chips in response to thermal expansion of said contactor, and then performing a burn-in on all of said plural semiconductor chips.

2. The inspecting method for a semiconductor device defined by claim 1, further comprising a fifth step of performing a before-shipment inspection on each of said plural semiconductor chips subjected to said burn-in.

3. The inspecting method for a semiconductor device defined by claim 1, further comprising, between said second step and said third step, a step of judging whether each semiconductor chip is defective or not and removing said each semiconductor chip from said sheet when said each semiconductor is judged to be defective.

4. The inspecting method for a semiconductor device defined by claim 1, further comprising, before said first step, a step of heating said sheet to contract said sheet.

5. The inspecting method for a semiconductor device defined by claim 1, wherein said first step includes a step of fixing said sheet fixed to said semiconductor wafer on a substrate having substantially the same thermal expansion coefficient as that of said contactor.

6. The inspecting method for a semiconductor device defined by claim 5, wherein said first step includes a step of fixing said sheet fixed to said semiconductor wafer on said substrate by a suction force.

7. The inspecting method for a semiconductor device defined by claim 6, wherein said first step includes a step of fixing said sheet fixed to said semiconductor wafer on said substrate by said suction force acting from a suction hole formed in a specific region on said substrate where said suction hole does not confront with said test electrode formed on said semiconductor chip.

8. The inspecting method for a semiconductor device defined by claim 1, further comprising, before said first step, a step of providing protrusions on said contactor along a scribe line of said semiconductor wafer, wherein said third step includes a step of inserting said protrusions of said contactor into each gap between adjacent semiconductor chips; and said fourth step includes a step of expanding said gap between said adjacent semiconductor chips by utilizing thermal expansion of said protrusions which shift toward a peripheral edge of said contactor in response to thermal expansion of said contactor itself.

9. The inspecting method for a semiconductor device defined by claim 1, further comprising, before said first step, a step of providing probe terminals on said contactor being engageable with and arranged at a position corresponding to the test electrodes formed on said semiconductor chips, respectively, wherein said third step includes a step of coupling each probe terminal of said contactor with said corresponding test electrode of said semiconductor chip; and said fourth step includes a step of expanding said gap between said adjacent semiconductor chips by utilizing thermal expansion of said probe terminals which shift toward a peripheral edge of said contactor in response to thermal expansion of said contactor itself.

10. An inspecting method for a semiconductor device, comprising:

a first step of fixing a semiconductor wafer on a substrate, said semiconductor wafer being formed with a plurality of semiconductor chips each having a test electrode, said substrate having substantially the same thermal expansion coefficient as that of a contactor which has probe terminals each supplying an electric signal to said test electrode of each semiconductor chip;

a second step of dividing said plural semiconductor chips by dicing said semiconductor wafer fixed on said substrate without dividing said substrate;

a third step of aligning said contactor against said semiconductor wafer subjected to said dicing operation, and bringing said test electrode of each semiconductor chip into contact with a corresponding probe terminal of said contactor; and a fourth step of heating said semiconductor wafer fixed to said substrate so as to expand a gap between adjacent semiconductor chips in response to thermal expansion of said substrate, and then performing a burn-in on all of said plural semiconductor chips.

11. The inspecting method for a semiconductor device defined by claim 10, further comprising a fifth step of performing a before-shipment inspection on each of said plural semiconductor chips subjected to said burn-in.

12. The inspecting method for a semiconductor device defined by claim 10, further comprising, between said second step and said third step, a step of judging whether each semiconductor chip is defective or not and removing said each semiconductor chip when said each semiconductor is judged to be defective.

13. The inspecting method for a semiconductor device defined by claim 10, wherein said first step includes a step of fixing said semiconductor wafer on said substrate by bond.

14. The inspecting method for a semiconductor device defined by claim 10, wherein said first step includes a step of fixing said semiconductor wafer to said substrate, interposing an expandable sheet.

15. The inspecting method for a semiconductor device defined by claim 10, wherein said first step includes a step of fixing said semiconductor wafer to said substrate by a suction force.

16. The inspecting method for a semiconductor device defined by claim 15, wherein said first step includes a step of interposing a porous sheet between said sheet and said substrate.

17. The inspecting method for a semiconductor device defined by claim 15, wherein said first step includes a step of fixing said semiconductor wafer to said substrate by a suction force acting from a suction hole formed in a specific region on said substrate where said suction hole does not confront with said test electrode formed on said semiconductor chip.

18. The inspection method for semiconductor devices defined by claim 15, further comprising, before said first step, a step of forming a plurality of suction holes on said substrate, and interposing a sheet between said semiconductor wafer and said substrate, said sheet having through holes respectively corresponding to said plural semiconductor chips, wherein said first step includes a step of fixing said semiconductor wafer to said substrate by a suction force acting from said through holes formed on said sheet and said suction holes of said substrate.

* * * * *